(12) United States Patent
Jaenen et al.

(10) Patent No.: US 7,223,162 B2
(45) Date of Patent: May 29, 2007

(54) HOLDER FOR WAFERS

(75) Inventors: Jean-Paul Jaenen, Genk (BE); Peter Van Gerwen, Keerbergen (BE)

(73) Assignee: Vivactis N.V., Leuven (BE)

( * ) Notice: Subject to any disclaimer, the term of this patent is extended or adjusted under 35 U.S.C. 154(b) by 0 days.

(21) Appl. No.: 11/130,294

(22) Filed: May 16, 2005

(65) Prior Publication Data
US 2005/0266781 A1   Dec. 1, 2005

(30) Foreign Application Priority Data
May 14, 2004   (GB)  ................ 0410743.9

(51) Int. Cl.
B24B 41/06   (2006.01)
(52) U.S. Cl. ............... 451/364; 438/403; 269/900; 269/903
(58) Field of Classification Search ............... 451/41, 451/285, 287, 364, 365; 438/401, 403, 716; 29/593; 269/289 R, 329, 21, 900, 903
See application file for complete search history.

(56) References Cited
U.S. PATENT DOCUMENTS
3,678,385 A * 7/1972 Bruner ................ 324/754

5,314,538 A * 5/1994 Maeda et al. ............... 118/715
6,111,225 A * 8/2000 Ohkase et al. .............. 219/390
6,296,712 B1  10/2001 Guo et al.
2001/0050567 A1* 12/2001 Bachelder et al. .......... 324/754
2002/0187262 A1  12/2002 Rocha-Alvarez et al.
2004/0115947 A1* 6/2004 Fink et al. ................... 438/716
2005/0217799 A1* 10/2005 O'Meara et al. ....... 156/345.52

FOREIGN PATENT DOCUMENTS
WO   WO 99/25896 A   5/1999

* cited by examiner

*Primary Examiner*—Elleen P. Morgan
(74) *Attorney, Agent, or Firm*—Clark & Elbing LLP

(57) ABSTRACT

The present invention provides a holder (20) for wafers (14) which makes it possible to more easily manipulate the wafer (14) and makes it more suitable than prior art devices for to liquid handling, wafer handling and on-wafer manipulation of substances, while it also makes it possible to align the wafer (14) accurately and furthermore allows to create a well controlled ambient in the neighbourhood of the wafer (14).

20 Claims, 4 Drawing Sheets

HOLDER FOR WAFERS

CROSS REFERENCE TO RELATED APPLICATIONS

This application claims priority to British Application GB 0410743.9 filed May 14, 2004.

TECHNICAL FIELD OF THE INVENTION

The present invention relates to a holder for thin, flat substrates such as wafers, e.g. thin substrates comprising sensors or comprising structures made by microsystem technology.

BACKGROUND OF THE INVENTION

Miniaturization has been one of the most important technological trends in the last decades. The sizes of microchips and microelectronic circuits have been reduced from centimetres to micrometers resulting in a decreased size of consumer electronics goods, mobile phones, etc. Microsystem technology is a collection of all technologies that can be used for the manufacturing of devices having sizes smaller than a few mm, such as, for example, micro-sensors, micro-actuators or other micro-systems. Micro-systems engineering is one of the most promising technologies of this century. On the scale of microelectronic circuits, sensor and actuator functions are implemented in sectors like telecommunications, micro process engineering, and life sciences.

Microsystems often use silicon as a basic substance. Using micro-system technology, it is possible to make very sensitive and very precise architectures and/or sensors in silicon. Other substrate materials can be used although silicon has become dominant. The use of silicon, however, is limited to the silicon standard formats, being e.g. 4 inch, 150 mm, 200 mm, 300 mm round wafers with a thickness usually below 1 mm.

This makes these devices very hard to manipulate in a lab and/or robotized environment.

SUMMARY OF THE INVENTION

It is an object of the present invention to provide a holder for thin flat substrates such as wafers, e.g. thin substrates possibly comprising sensors or comprising structures made by microsystem technology, which provides an easy manipulation and handling of the wafer. It is a further object of the present invention to provide a holder for wafers which allows creation of a well controlled ambient in the neighbourhood of the wafer.

The above objective is accomplished by a method and device according to the present invention.

The present invention provides a holder for a wafer. The holder comprises at least one of:

At least one hole or guide-way to allow for electrical contacting between read-out and control electronics and the wafer, A first alignment system to precisely align the wafer in the holder, At least one release opening for taking the wafer out of the holder, At least one gas inlet to control ambient gas composition and/or humidity in the neighbourhood of the wafer, At least one, e.g. a first and/or a second, thermally insulating cavity, At least one insulating layer for thermal insulation, thermal heat sinking, electrical shielding, gas tightness and/or liquid tightness, At least one hole for dispensing liquids onto the wafer, At least one opening means to open or close the at least one hole, A second alignment system to precisely position the holder in a reader, and A guiding system to position the wafer in the holder.

The wafer may be a thin substrate comprising sensors or comprising other structures made by microsystem technology. It may also be thin (also planar) substrates made by, for example, injection moulding or similar fabrication technologies. It may furthermore be a plate housing samples for parallel testing.

The holder according to embodiments of the present invention may make it possible to manipulate the wafer more easily than prior art devices. The holder according to embodiments of the present invention may be more suitable to wafer handling than prior art devices. The holder according to embodiments of the present invention may be more suitable for liquid handling than prior art device. The holder according to embodiments of the present invention may be more suitable for on-wafer manipulation of substances than prior art devices. The holder according to embodiments of the present invention may make it possible to align the wafer accurately. The holder according to embodiments of the present invention may make it possible to create a well controlled ambient in the neighborhood of the wafer. The holder according to embodiments of the present invention may be used to align, for example, sensor plates and sample recipient plates. The holder according to embodiments of the present invention may furthermore be used to hold sample mixing aids such as, for example, magnetic stirring driving facilities.

According to an embodiment of the invention, the holder may comprise at least three parts, e.g. at least a first or bottom part, a second or middle or intermediate part and a third or top part, the at least three parts engaging with each other so as to form the holder. Any of the at least three parts may comprise engagement means for engagement with any of the other parts. The engagement means may be such that the at least three parts only fit together for engagement in a predetermined order. Alternatively, the engagement means could be such that at least two of the parts can be placed one instead of the other, i.e. such that at least two of the parts can switch places between each other.

The bottom part of the holder may comprise a recess of a suitable shape for holding a wafer to be positioned in the holder, e.g. a circular recess. The recess, e.g. a substantially circular recess, may be provided with recessed release openings, e.g. also substantially circular release openings, for removing the wafer from the holder. According to embodiments of the invention, the release openings may be cavities for manual removal of the wafer. In other embodiments, the release openings may be holes, e.g. cylindrical holes, extending through the bottom part of the holder for automatic removal of the wafer, for example, by using a tool that can enter the holes, e.g. in a direction from the lower surface of the bottom part toward the upper surface of the bottom part.

According to embodiments of the invention, a first thermally insulating cavity may be formed in the bottom part of the holder, such that the cavity is located between a first side of the wafer, e.g. its bottom side, and the remainder or bottom of the bottom part of the holder when the wafer is present in the holder, i.e. under the wafer if the holder is used in a typical position. This thermal insulating cavity serves for thermally insulating the wafer, or that part of the wafer carrying structures such as e.g. sensors or other structures formed by microsystem technologies, from the other parts of the holder.

According to other embodiments, a second thermally insulating cavity may be formed in an intermediate part, e.g. the middle part, of the holder. This second thermally insulating cavity may have the same properties and functions as the first thermally insulating cavity, but is now positioned at a second side of the wafer, the second side of the wafer being opposite to the first side of the wafer, e.g. its top side, the second thermally insulating cavity thus being located between the second side of the wafer and the top part of the holder when the wafer is present in the holder and the holder is used in a typical position. This thermally insulating cavity also serves for thermally insulating the wafer, or that part of the wafer carrying structures such as e.g. sensors or other structures formed by microsystem technologies, from the other parts of the holder.

In embodiments of the present invention, the at least one hole for dispersing liquids onto the wafer may be formed in the top part of the holder, and optionally also in one or more intermediate parts of the holder. According to embodiments of the invention, the holder may comprise a plurality of holes for dispersing liquids onto the wafer, and the holes may be provided as an array of holes, the array of holes for example being logically organized in rows and columns of holes which are equally spaced.

According to embodiments of the invention, the bottom part of the holder may have a centre and a first alignment system may be located away from the center, preferably as far as possible, including the first alignment system being present at or near an outer rim of the bottom part of the holder. In alternative embodiments, the first alignment system may be located in the recess for holding a wafer. By providing such first alignment system, displacement of the wafer in the holder may be minimized. In embodiments of the invention the first alignment system may comprise holes or pins. Corresponding parts of the first alignment system then may comprise pins respectively holes on the wafer or sensor plate.

In embodiments of the invention, the holder may comprise a first layer for thermal insulation, a second layer for electrical shielding and a third layer for gas tightness and/or a fourth layer for liquid tightness, although the layers need not be in this order. In embodiments of the present invention, the first, second, third and fourth layer are all present, again not necessarily in this order. The first layer may be formed of plastic, the second layer may be formed of copper and/or the third and fourth layer may be formed of rubber. The above layers may be part of any of the bottom, intermediate and/or top parts. Alternatively, these layers are located between the bottom, intermediate and/or top parts.

According to embodiments of the invention, the second alignment system to precisely position the holder in a reader may comprise holes, pins and/or slits. The second alignment system may comprise corresponding features e.g. on the bottom part and on the reader, or on the top part and on the reader, the corresponding features being for example a hole on the bottom part or top part and a pin on the reader or vice versa, or a slit in the reader and a protruding part for sliding in the slit on the top part or bottom part, or vice versa.

A holder according to embodiments of the present invention has at least one opening/closing means that can take a first and a second position, the first position corresponding to a closed condition of the at least one hole and the second position corresponding to an open condition of the at least one hole. Opening/closing means is furthermore provided with a resilience means for keeping the opening/closing means in the first position, i.e. in a position such that the at least one hole is closed. Upon actuation of the opening/closing means, the opening/closing means is moved towards its second position against the resilience of the resilience means so as to open the at least one hole. As soon as the actuation of the opening/closing means is stopped, the opening/closing means is moved back, under influence of the resilience means, towards its first position so as to close the at least one hole.

For a holder according to embodiments of the present invention, which is adapted to accommodate a wafer lying in a first plane when present in the holder, the opening/closing means may have a shape adapted to move the opening/closing means towards its second position under influence of a force perpendicular to the first plane of the wafer. Therefore, the opening/closing means may have a slanted shape.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
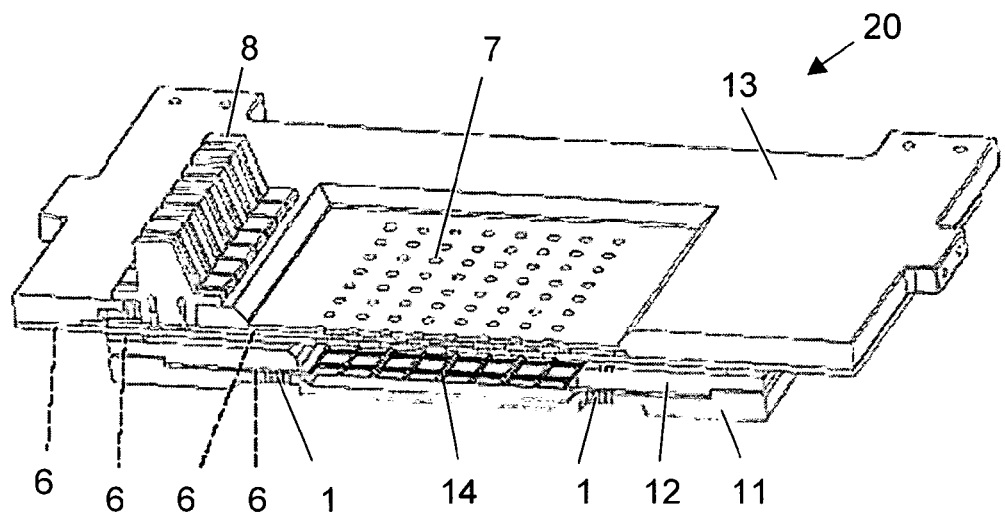
FIG. 1 shows a cross-section of a perspective view of a configuration of a holder including a wafer or sensor plate according to an embodiment of the invention.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

The present invention provides a holder for thin, flat preferably stiff and self-supporting substrates such as wafers. In the invention, the term wafer can mean a thin planar substrate possibly comprising sensors or comprising structures made by microsystem technology. The wafers may comprise semiconductor material such as silicon. The sensors may be semiconductor sensors. It may also mean thin (also planar) substrates made by, for example, injection moulding or similar fabrication technologies. It can furthermore mean a plate housing samples for parallel testing.

The holder according to the invention may comprise at least one of the following features. In embodiments of the present invention, a holder may comprise combinations of a plurality of the following features, e.g. two or three or more:

1. At least one hole or guide-way to allow for electrical contacting between read-out and control electronics and the wafer.
2. A first alignment system (e.g. pins) to precisely align the wafer in the holder.
3. At least one release opening for taking the wafer out of the holder again. This can be a cavity for manual lifting, or a complete hole allowing for automatic removal of the wafer.
4. At least one gas inlet to control ambient gas composition in the neighbourhood of the wafer, e.g. to increase humidity.
5. At least one thermally insulating cavity under the wafer, more particularly underneath the sensor devices on the wafer.
6. At least one insulating layer for thermal insulation (e.g. a layer made from plastics material), for thermal heat sinking (e.g. a ceramics layer), for electrical shielding (e.g. a copper layer) for gas tightness (e.g. a rubber layer) and/or for liquid tightness (e.g. a rubber layer).
7. At least one hole, preferably a plurality of holes, for dispensing liquids onto the wafer, more particularly onto the sensors implemented on the wafer.
8. An opening/closing means, e.g. a slider, to open/close this at least one hole, or a plurality of opening/closing means, e.g. sliders, to open/close the plurality of holes.
9. A second alignment system (e.g. holes) to position the holder in a reader precisely. The second alignment system is preferably located away from the centre of the holder to prevent wrong orientation.
10. A guiding system to position a wafer in the holder.

The numbers of the items above which list the different possible properties of the holder according to embodiments of the present invention refer to the reference numbers in the drawings, and will be described in more detail hereinafter.

In FIG. 1 a perspective cross-sectional view of a holder 20 according to an embodiment of the invention is illustrated. It has to be understood that this is only one example and is not limiting to the invention. The holder 20 according to this embodiment of the invention comprises a plurality of parts, as illustrated, i.e. a first or bottom part 11, a second, intermediate or middle part 12 and a third or top part 13. In alternative embodiments of the present invention, not illustrated in the drawings, more than three parts may form the holder 20, this holder 20 then comprising a plurality of intermediate or additional parts. In the example illustrated, in between the second or middle part 12 and the third or top part 13, and in between the second or middle part 12 and the first or bottom part 11, a plurality of layers 6 for thermal insulation (e.g. plastic), thermal heat sinking (e.g. ceramics), electrical shielding (e.g. copper), gas tightness and/or liquid tightness (e.g. rubber) may be provided. In the example illustrated in FIG. 1, four such layers 6 are present. In a preferred embodiment, three of these layers 6 may be present between the second or middle part 12 and the third or top part 13, and one such layer 6 may be present between the second or middle part 12 and the first or bottom part 11. In that case, as illustrated in FIG. 1, the layers in between the second or middle part 12 and the third or top part 13 may be, from top to bottom, a layer for thermal isolation, for example a plastic layer, a layer for electrical shielding, for example a copper layer, and a layer for gas and/or liquid tightness, for example a rubber layer. The layer 6 in between the second or middle part 12 and the first or bottom part 11 may be a further layer for gas and/or liquid tightness, for example a rubber layer. In other embodiments more or less layers 6 may be present, the sequence of the different layers 6 may be different from the one given above, the location of particular layers, i.e. between the second or middle part 12 and the first or bottom part 11 or between the second or middle part 12 and the third or top part 13, may be different, and the materials used for the layers at those locations may be different. All suitable combinations of the above layers at both locations, i.e. between the second or middle part 12 and the first or bottom part 11 or between the second or middle part 12 and the third or top part 13, may be used. Furthermore, if more than one intermediate part is present, layers 6 may be present in between intermediate parts as well. These layers 6 in between intermediate parts may be present in any suitable number and from any suitable material, and this in any suitable combination.

A wafer 14, which in the example given may be a sensor plate but in alternative embodiments may also be a substrate comprising structures, other than sensors, made by microsystem technology, may be provided in between the first or bottom part 11 and the second or middle part 12 of the holder 20. In alternative embodiments, a wafer 14 may be present in between two intermediate parts, or between an intermediate part and the top part 13. In all embodiments, the wafer 14 is located between the bottom part 11 and the top part 13.

Figure 2:
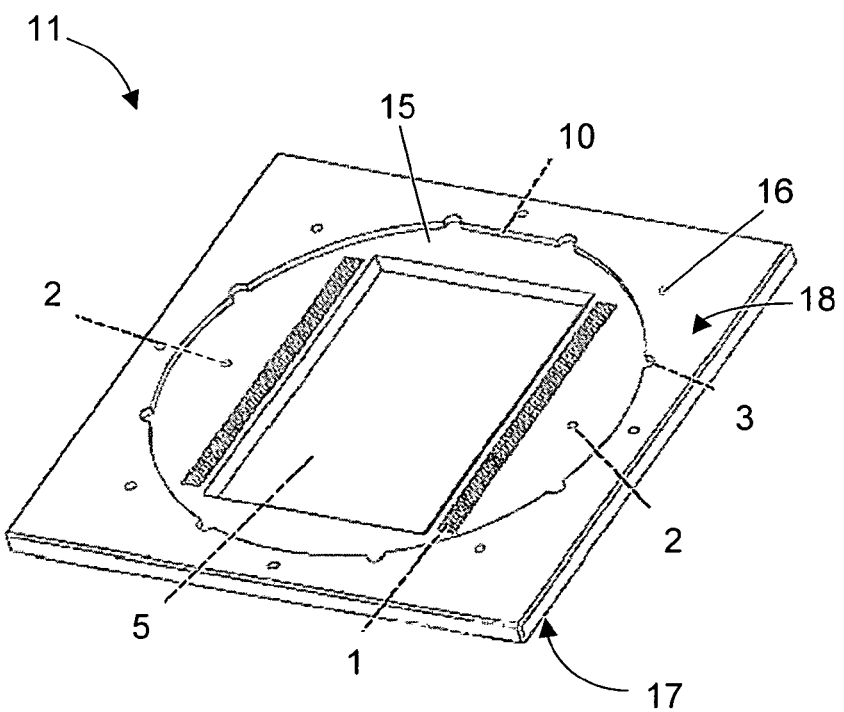
FIG. 2 is a top view of a bottom part of a holder according to an embodiment of the invention.
Figure 3:
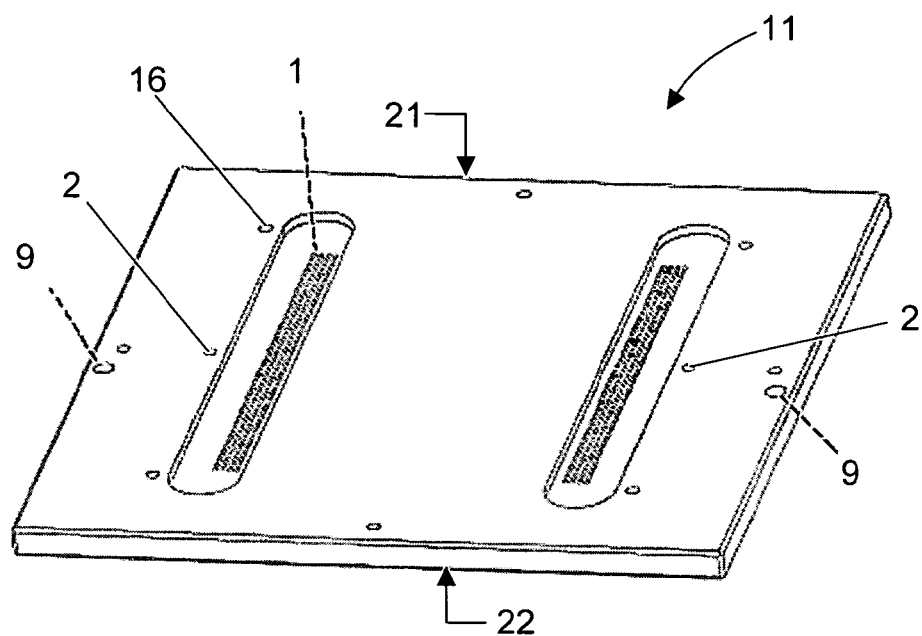
FIG. 3 is a bottom view of a bottom part of a holder according to an embodiment of the invention.

The first or bottom part 11, also illustrated in more detail in FIGS. 2 and 3, may comprise at least one hole or guide-way 1, possibly a plurality of holes or guide-ways 1, to allow for electrical contacting, e.g. between read-out and/or control electronics (not represented in the drawings) on the one hand, and the wafer 14 present in the holder 20 on the other hand.

Figure 6:
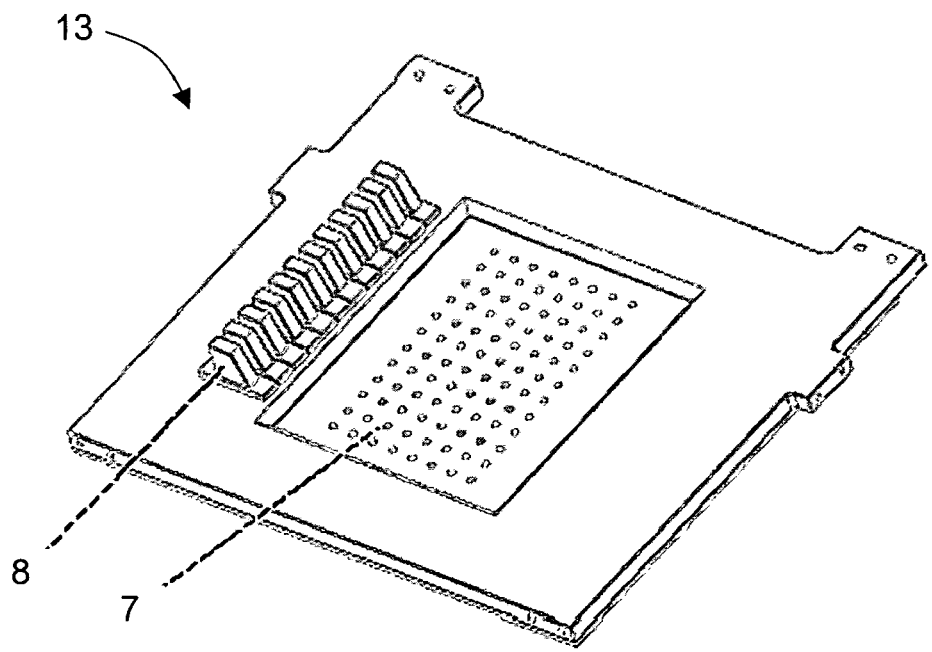
FIG. 6 is a top view of a top part of a holder according to an embodiment of the invention.

The third or top part 13, also illustrated in more detail in FIG. 6, may comprise holes 7 for dispensing fluids, e.g. liquids or gasses onto the wafer 14. For example, in case the wafer 14 is a sensor plate, the holes 7 are suitable for dispensing liquids to be analysed or tested onto the sensor devices on the sensor plate.

On the top part of the holder 20, also at least one opening/closing means, e.g. at least one slider 8, is provided to open and close the holes 7 for dispensing fluids, e.g. liquids or gasses onto the wafer 14.

Hereinafter, the different parts of the holder 20 will be discussed in more detail.

FIG. 2 shows a top view of the first or bottom part 11 of the holder 20 as illustrated in FIG. 1, and FIG. 3 shows a bottom view thereof. The first or bottom part 11 comprises a recess 15 with a suitable shape for holding a wafer 14, i.e. presently typically a substantially circular recess 15. The recess 15 has dimensions not smaller than the dimensions of the wafer 14 to be accommodated therein, preferably dimensions substantially equal to the dimensions of the wafer 14. In case of a substantially circular recess 15, it has a diameter that is not smaller than, preferably substantially equal to, the diameter of the wafer 14 that has to be positioned in it. The recess 15 may comprise a guiding system 10 for correctly positioning the wafer 14 in the holder 20. This guiding system 10 may be any system for ensuring that a wafer 14 is correctly positioned into the recess 15. This guiding system 10 may be any bulge or notch in the shape of the recess 15, corresponding to a corresponding bulge or notch in the shape of the wafer 14 to be treated. For example, presently silicon wafers 14 are typically of a substantially circular shape provided with a flat side. Therefore, the recess 15 may be provided with a corresponding substantially circular shape with a flat side (indicated by reference number 10 in FIG. 2). In that way, the silicon wafer 14 can only be positioned in the holder 20 in one way.

The first or bottom part 11 furthermore comprises an alignment system 2 to align the wafer 14 in the holder 20 precisely. The alignment system 2 on the bottom part 11 may, for example, comprise first features such as e.g. pins or holes. The wafer 14 to be aligned with the bottom part 11 then comprises second features corresponding to the first features on the bottom part 11, such as e.g. holes or pins. In the example illustrated in FIG. 2, the alignment system 2 comprises two protruding parts such as pins, bosses or bulges, which correspond to holes in the wafer 14 or sensor plate to be aligned with the holder 20. The holes in the wafer 14 or sensor plate are such that, when the wafer 14 or sensor plate is aligned with the holder 20, they exactly fit the protruding parts such as pins or bulges on the bottom part 11 of the holder 20. The alignment system 2 may be positioned in or on the surface to be covered by a wafer 14 to be treated, i.e. for example in the recess 15 for holding the wafer 14, and preferably as far as possible from the centre of the surface to be covered by the wafer 14, e.g. the centre of the recess 15 in the first or bottom part 11, in order to minimise the possible displacement of the wafer 14 with respect to the first or bottom part 11.

In embodiments of the present invention, a combination of the alignment system 2 and the guiding system 10, both described hereinabove, ensure that a wafer 14 can only be put into the recess 15 of the holder 20 in one possible way. The alignment system 2 makes sure that the wafer 14 cannot be displaced according to a translational movement in the plane of the first or bottom part 11, and the guiding system 10 makes sure that the wafer 14 cannot be placed in the holder under an angle.

The recess 15 furthermore comprises, at its outer circumference, release openings 3 for enabling the wafer 14 to be taken out of the holder 20. The openings 3 can be cavities, i.e. with a bottom closed off by the remainder of the first or bottom part 11, as is illustrated in FIG. 2. However, in other embodiments, the openings 3 may be holes extending through the first or bottom part 11 and allowing for automatic removal of the wafer 14 by pushing the wafer 14 out by means of a suitable tool which may be positioned in the holes in a direction from a first surface 17 of the bottom part 11, the first surface 17 being at the bottom side of the bottom part 11 which is at the side opposite to the side where the recess 15 is, toward a second surface 18 of the bottom part 11, the second surface 18 being at the top side of the bottom part 11 of the holder 20. The release openings 3 may be substantially circular in cross-section, they may have the shape of part of a circle, or they may have any other suitable shape. In case of holes extending through the bottom part 11, the shape of the release openings 3 preferably corresponds to the shape of the removal tool to be used. The dimensions of the release openings should not be smaller than the dimensions of the removal tool to be used.

Furthermore, the bottom part 11 of the holder 20 may comprise a thermally insulating cavity 5. The thermally insulating cavity 5 is positioned in the bottom part 11 such that it is located under structures, e.g. sensors or other structures formed by microsystem technology, formed onto the wafer 14, when this wafer is positioned in the holder 20. The thermally insulated cavity 5 thermally isolates these structures, e.g. sensors, from the rest of the system and provides the possibility for accurately determining the temperature of these structures, e.g. sensors.

The first or bottom part 11 of the holder 20 may also comprise holes 16 for receiving a closure means (not shown), such as a screw or pin, for attaching the bottom part 11 to at least an intermediate part, preferably for attaching all parts forming the holder to each other, e.g. for attaching the bottom part 11 to the middle part 12 and top part 13 of the holder 20. The holes 16 on the first or bottom part 11 of the holder 20 are positioned so as to be aligned with corresponding holes 16 for receiving closure means which are present in intermediate and/or top parts, e.g. in the middle and top parts 12, 13 of the holder 20.

FIG. 3 shows a bottom view of the first or bottom part 11 of the holder 20 illustrated in FIGS. 1 and 2. From this figure it can be seen that the bottom part 11 of the holder 20 comprises a further alignment system 9 to position the holder 20 in a reader precisely (not represented in the drawings). A reader is an electronic device for extracting sensor information from a sensor-plate. It can be seen that this further alignment system 9, which may comprise first features such as e.g. pins, slits or holes, may optionally be positioned asymmetrically with respect to a first side 21 and a second side 22, the first side 21 being positioned opposite to the second side 22. This optional asymmetric positioning of the further alignment systems 9 is to make sure that the holder 20 can be positioned in the reader in only one possible way. The first features of the further alignments system 9 on the bottom part 11 of the holder, fit with corresponding second features on the reader with which the holder 20 is to be aligned. For example, in the example illustrated in FIG. 3 first features of the further alignment systems 9 may be holes. In that case, the reader may comprise corresponding second features such as pins which, when the holder 20 is positioned into the reader, are positioned into the holes 9 of the holder 20, in that way ensuring a precise and correct position of the holder 20 in the reader. Again, the further alignment system 9 may be positioned away from the centre of the bottom part 11, preferably as far away as possible, so as to minimise possible displacement of the holder 20 in the reader. It has to be noted that these further alignment system 9 preferably comprises features different from the alignment system 2 meant for alignment of the wafer 14 in the holder 20. The features may be different by one or more of their shape, their position, and/or the fact that they stand out or not.

Figure 4:
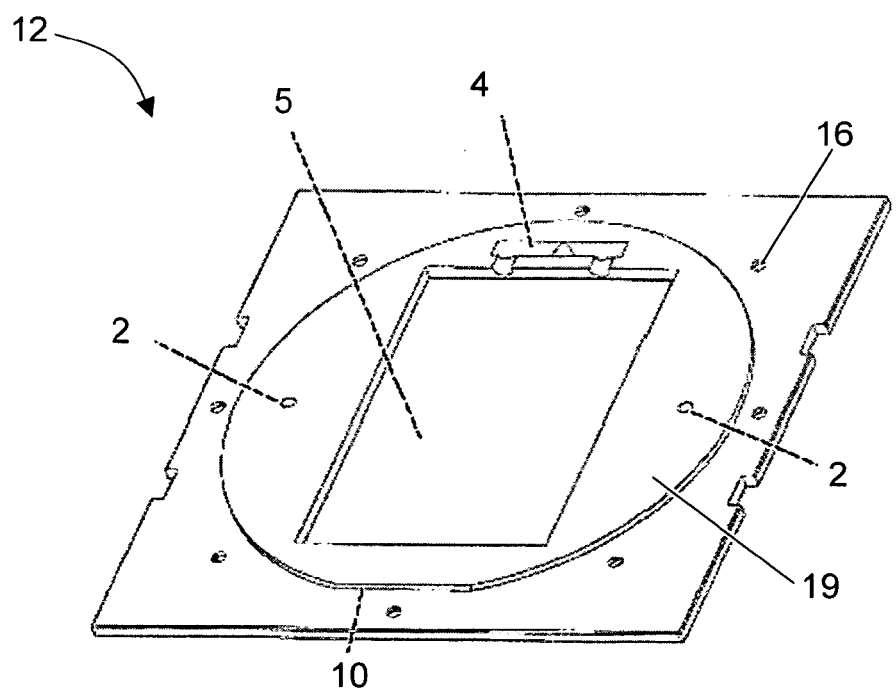
FIG. 4 is a bottom view of a middle part of a holder according to an embodiment of the invention.
Figure 5:
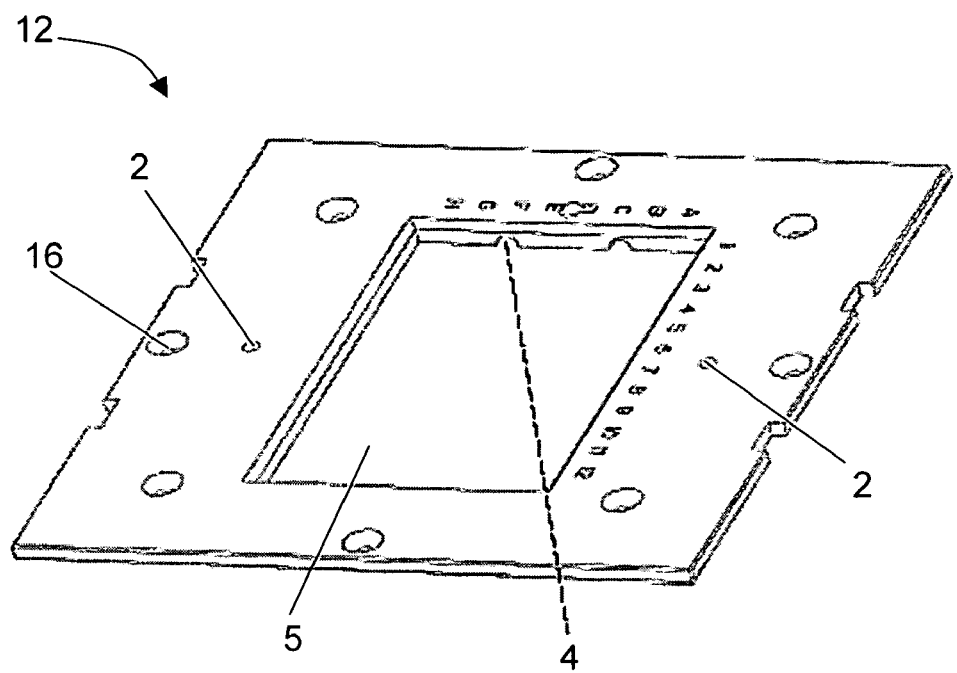
FIG. 5 is a top view of a middle part of a holder according to an embodiment of the invention.

FIG. 4 and FIG. 5 are a bottom view and a top view respectively of an embodiment of an intermediate part, e.g. the second or middle part 12 of the holder 20 according to an embodiment of the present invention. The middle part 12 of the holder 20 may comprise an opening of any suitable shape, for example a rectangular shaped opening, which forms a thermally insulating cavity 5 above the structures, e.g. sensors or other structures formed by microsystem technology onto the wafer 14, when the third or top part 13 of the holder 20 is positioned on top of the second or middle part 12 of the holder 20 and a wafer 14 is located between the first or bottom part 11 and the second or middle part 12. The thermally insulating cavity 5 of the second or middle part 12 of the holder 20 has the same functionality as the thermally insulating cavity 5 of the first or bottom part 11 of the holder 20 and is therefore indicated with the same reference number.

The second or middle part 12 of the holder 20, i.e. that intermediate part which is intended to fit on the bottom part 11, may comprise a protruding part 19 of a shape which is such that it fits into the recess 15 present in the first or bottom part 11 of the holder 20. For example, the protruding part 19 may be substantially circular so as to fit the substantially circular recess 15. For easy fitting the protruding part 19 can have smaller in-plane dimensions, e.g. diameter, than the dimensions of the recess 15.

The protruding part 19 may comprise a guiding system 10 similar to the guiding system 10 of the bottom part 11. The guiding system 10 of the second or middle part 12 may again be any bulge or notch in the shape of the protruding part 19, corresponding to a corresponding bulge or notch in the shape of the recess 15. For example, presently silicon wafers 14 are typically of a substantially circular shape provided with a flat side. Therefore, the recess 15 may be provided with a corresponding substantially circular shape with a flat side (indicated by reference number 10 in FIG. 2), and the protruding part 19 may be provided with a corresponding substantially circular shape with a flat side (indicated by reference number 10 in FIG. 4).

The second or middle part 12 of the holder 20 may furthermore comprise gas inlets 4 to control the ambient gas composition in the neighbourhood of the wafer 14 when located in the holder 20, for example, to create e.g. an $N_2$ atmosphere in the cavity 5 or to increase the humidity in the cavity 5, for example, up to 90%.

Also the second or middle part 12 of the holder 20 may comprise holes 16 for receiving a closure means (not shown), such as a screw or pin, for attaching the intermediate part, e.g. middle part 12, to neighbouring parts, i.e. to other intermediate parts, to the bottom part 11 or to the top part 13. In the example illustrated, the middle part 12 comprises holes 16 for receiving a closure means for attaching the middle part 12 to the bottom and top parts 11, 13 of the holder 20. The holes 16 on the second or middle part 12 of the holder 20 are positioned such that they are aligned with the holes 16 in the other parts 11, 13 of the holder 20.

The middle part 12 may furthermore comprise an alignment system 2 to precisely align the wafer 14 in the holder 20. The alignment system 2 may, for example, comprise first features such as protruding parts, e.g. pins, or holes. These first features correspond in location, shape and size with second features in the wafer 14 the middle part 12 has to be aligned with. In the example illustrated in FIG. 2, the alignment system 2 comprises as first features pins on the middle part 12, which fit with corresponding holes in the wafer 14 or sensor plate. The alignment system 2 may be positioned on the protruding part 19, and preferably as far as possible from the centre of the protruding part 19, corresponding to the centre of the wafer 14, in order to minimise the possible displacement of the wafer 14 with respect to the second or middle part 12.

A plurality of intermediate parts, having one or more of the features of the middle part 12 as described above, may be present in a holder 20 according to embodiments of the present invention.

In FIG. 6, a top view of the third or top part 13 of the holder 20 is illustrated. The top part 13, as illustrated in this figure, may comprise an array of holes 7 for dispensing liquids onto the structures, e.g. sensors or other structures formed on a wafer 14 by means of microsystem technology. From the cross-sectional view in FIG. 1 it can be seen the top part 13 of the holder 20 according to the specific example of the embodiment illustrated, comprises a plurality of plates which are moveable with respect to each other in a direction in the plane of the plates, i.e. two or more plates, in the example illustrated three plates, each comprising an array of holes 7, the arrays of holes of the different plates corresponding to each other in one position of the plates, i.e. there exists a position of the three plates so that the holes 7 in the plurality of plates are located exactly on top of each other. When no fluid, e.g. liquid or gas, is to be provided onto the wafer 14 positioned in the holder 20, the arrays of holes 7 of the plurality of plates, e.g. three plates, are positioned such that the plates are not in the position wherein the holes in the plurality of plates are located exactly on top of each other. For example, the holes 7 of the lower plate and the holes 7 of the upper plate are aligned with each other but are not aligned with the holes 7 of the middle plate. Globally seen, the holes 7 of the top plate are closed because no liquid can be provided through these holes 7 to the wafer 14. For providing a liquid onto the wafer 14, the holes 7 of the plurality of plates should be aligned with each other, e.g. the holes 7 of the middle plate should be aligned with the holes 7 of the upper and lower plate. Therefore, according to FIG. 6, the top part 13 may furthermore comprise at least one opening/closing means, e.g. at least one slider 8, to open and close the holes 7.

For example, in the example given, the top part 13 of the holder 20 may comprise an array of holes 7. The holes 7 may be logically organised in the array in rows and columns. Throughout this description, the terms "horizontal" and "vertical" (related to the terms "row" and "column" respectively) are used to provide a co-ordinate system and for ease of explanation only. They do not need to, but may, refer to an actual physical direction of the rows and columns of holes 7 in the array. The terms "column" and "row" are used to describe sets of array elements, in this case holes 7, which are linked together. The linking can be in the form of a Cartesian array of rows and columns however the present invention is not limited thereto. As will be understood by those skilled in the art, columns and rows can be easily interchanged and it is intended in this disclosure that these terms be interchangeable. Also, non-Cartesian arrays may be constructed and are included within the scope of the invention. Accordingly the terms "row" and "column" should be interpreted widely. To facilitate in this wide interpretation, the terminology logically organised rows and columns may be used. By this is meant that sets of holes 7 are linked together in a topologically linear intersecting manner; however, that the physical or topographical arrangement need not be so. For example, the rows may be circles and the columns radii of these circles and the circles and radii are described in this invention as "logically organised" in rows and columns. It should be understood that all these terms are used only to facilitate a better understanding of the specific structure being described, and are in no way intended to limit the invention. The array may be formed of a plurality of rows and columns, each row comprising e.g. eight holes 7 and each column comprising e.g. twelve holes 7. As illustrated in FIG. 6, at least one slider 8 may be present for opening/closing the holes 7. By pushing the at least one slider 8 in a direction away from the array of holes 7, the plates may be moved so that the holes 7 are aligned, e.g. the middle plate may be displaced in the direction of movement of the at least one slide 8, and in that way, the holes 7 of the middle plate may be aligned with the holes 7 of the upper and lower plate, hence making it possible to provide liquid onto the wafer 14 that is positioned in the holder.

In a preferred embodiment, each column (indicated as nr. 1 to 12 in FIG. 5) of holes 7 in the array of holes, has its own slider 8, as illustrated in FIG. 6. In this case, the moveable plate, e.g. the middle plate, comprises a plurality of individually moveable plate parts, e.g. one plate part for each column. Each separated small plate part can then move independently from the other small plate parts covering other columns. Those plate parts have amongst others i) a thermally insulating function (being plastic) and ii) a closure function for closing the holes of the corresponding column, hence creating the thermally isolated cavity 5. In the embodiment here described, the plate parts are sandwiched between two other plates, and a resilience means such as e.g. a spring pushes the slider 8 so that in non-actuated position of the slider the holes 7 of the middle plate do not correspond to the holes 7 of the top and bottom plate, so that the holes remain closed and no liquid can be delivered to the wafer 14 or sensor plate (e.g. in FIG. 6 the middle plate, or the plurality of middle plate parts are all positioned to the right-hand side of the device). The at least one slider 8 is adapted so as to allow movement, i.e. actuation, of the slider 8 so as to align the holes 7 of the plates or plate parts, thus opening at least some of the holes. In the embodiment illustrated in FIG. 6, the tilted angle of the slider 8 allows for a vertical pin, moving down together with e.g. dispensing needles, to slide the slider 8, e.g. to the left in the embodiments illustrated in FIG. 6, and so to open up the holes (a vertical movement is translated into a horizontal by means of the slope). Furthermore, the resilience means, e.g. spring, provides the force to close the holes 7 again, once the pin pressing on the slider 8 is released. In alternative embodiments, a plurality of columns may be provided with a single slider 8, in which case a plate part also covers a plurality of columns. Movement of a slider 8 then opens up holes in a plurality of columns.

In a specific example, liquid may be provided onto the wafer 14 by means of a specific tool (not illustrated in the drawings). For the example illustrated in FIG. 6, this tool may, for example, comprise eight supply devices, e.g. needles, i.e. as many supply devices as there are holes 7 in a row, for injecting fluid into these holes 7, the supply devices, e.g. needles, being positioned on a row and having spaces in between each supply device, e.g. needle, substantially equal to the spaces between the holes 7 in a row. The tool may furthermore comprise a pen which is positioned such that when the supply devices, e.g. needles, are positioned above a row of holes 7, the pen pushes against the slider 8 which is positioned next to the row above which the tool is positioned. The slider 8 may have a slanted side at that side of the slider 8 closest to the array of holes 7. By pushing against the slanted side of the slider 8, the slider 8 is moved in a direction away from the array of holes 7 and the holes 7 are opened as described above. When the down-force is removed, the holes 7 close again by the force of resilience means such as e.g. a spring pushing the slider 8 back to the right. An advantage of this example is that the holes 7 are open for only a small period of time. This minimises the chance of contamination of the liquid that is provided onto the wafer 14. Furthermore, it minimises disturbance of the controlled environment in the cavity above the wafer 14 or sensor plate.

Figure 7:
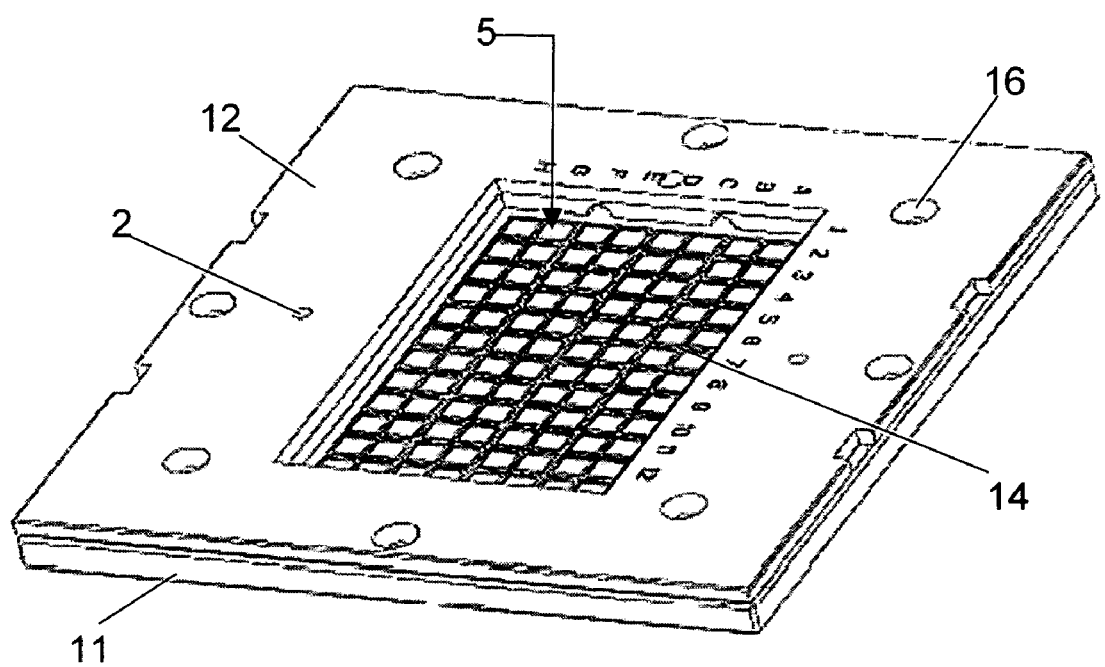
FIG. 7 is a top view of the combination of the bottom part of FIGS. 2 and 3 and the middle part of FIGS. 4 and 5, with a wafer or sensor plate therebetween.

FIG. 7 illustrates the bottom part 11 and the middle part 12 of the holder 20 attached to each other and having a wafer 14 positioned in between them. From this figure it becomes clear that the thermally insulating cavity 5 in the second or middle part 12 of the holder is positioned above the structures, e.g. sensors or other structures, of the wafer 14.

The holder 20 according to the invention may at least partly be made of e.g. polymers such as polyurethane, glass, ceramic, silicon or a metal. According to embodiments of the invention, the holder 20 may be made of a laminated polymer/glass fibre material because this allows perfect planarisation.

The planar dimensions of the holder 20 according to embodiments of the present invention may be in the range from a few millimetres, such as in the case of for example sensor chips, to approximately 1 meter, such as in the case of for example a matrix of full wafer parts. The height of the holder 20 according to the invention may range from a few millimeter to a few centimetre.

The holder 20 according to embodiments of the invention makes it possible to more easily manipulate a wafer 14 comprising a substrate with structures such as e.g. sensors or other structures formed by microsystem technologies on it. Furthermore, the holder 20 of embodiments of the invention makes the wafer 14 more suitable for liquid handling, wafer handling and on-wafer manipulation of substances and makes it possible to align the wafer 14 accurately in the holder 20. Moreover, when the holder 20 comprises a gas inlet 4 to control the ambient gas composition in the thermally insulating cavity 5 of the second or middle part 12 of the holder 20, it is possible to create a well controlled ambient in the neighbourhood of the sensors or other structures formed by microsystem technologies on the wafer 14. The holder 20 according to embodiments of the present invention may be used to align, for example, sensor plates, recipient plates or other wafers 14. It may furthermore be used to hold sample mixing aids such as, for example, magnetic stirring driving facilities.

It has to be understood that holder configuration described in detail in the above description only is one example of a possible configuration of a holder 20 according to the present invention. It should be clear for a person skilled in the art that other configurations may be possible, i.e. configurations which comprise other combination of the above-described properties.

It is to be understood that although preferred embodiments, specific constructions and configurations, as well as materials, have been discussed herein for devices according to the present invention, various changes or modifications in form and detail may be made without departing from the scope and spirit of this invention.

What is claimed is:

1. A holder for a sensor plate comprising sensor devices, the holder comprising:
    at least a bottom part, an intermediate part and a top part,
    a thermally insulating cavity in the bottom part, and
    in the top part, a plurality of holes for dispensing liquids onto the sensor devices of the sensor plate wherein the holes are provided as an array of holes.

2. A holder according to claim 1, wherein the bottom part comprises a recess for holding the sensor plate.

3. A holder according to claim 2, wherein the recess is substantially circular in shape.

4. A holder according to claim 2, wherein the recess is provided with release openings for taking the sensor plate out of the holder.

5. A holder according to claim 4, wherein the release openings are cavities for manual lifting of the sensor plate.

6. A holder according to claim 4, wherein the release openings are holes for automatic removal of the sensor plate.

7. A holder according to claim 1, wherein a further thermally insulating cavity is formed in the middle part of the holder.

8. A holder according to claim 1, the holder furthermore comprising a first alignment system formed in the bottom part to precisely align the sensor plate in the holder.

9. A holder according to claim 8, the bottom part having a centre, wherein the first alignment system is positioned away from the centre.

10. A holder according to claim 8, wherein the first alignment system comprises pins or holes.

11. A holder according to claim 1, the holder furthermore comprising at least one insulating layer for thermal insulation, thermal heat sinking, electrical shielding, gas tightness and/or liquid tightness in between the bottom part and intermediate part and/or in between the intermediate part and the top part of the holder.

12. A holder according to claim 11, wherein the holder comprises:
    situated between the intermediate part and the top part, any or a combination of a first layer for thermal insulation, a second layer for electrical shielding, a third layer for gas tightness, and or
    situated between the intermediate part and the bottom part, a fourth layer for liquid tightness.

13. A holder according to claim 8, the holder furthermore comprising a second alignment system formed in the bottom part to precisely position the sensor plate in a reader.

14. A holder according to claim 13, wherein the second alignment system comprises holes, pins or slits.

15. A holder according to claim 1, the holder furthermore comprising one opening/closing means to open or close the one hole for dispensing liquids onto the sensor devices of the sensor plate.

16. A holder according to claim 15, wherein the one opening/closing means can take a first and a second position, the first position corresponding to a closed condition of the one hole and the second position corresponding to an open condition of the one hole, the opening/closing means furthermore being provided with a resilience means for keeping the opening/closing means in the first position.

17. A holder according to claim 16, a sensor plate lying in a first plane when present in the holder, wherein the opening/closing means has a shape adapted to move the opening/closing means towards its second position under influence of a force perpendicular to the first plane of the sensor plate.

18. A holder according to claim 17, wherein the opening/closing means has a slanted shape.

19. A holder according to claim 1, the holder furthermore comprising at least one gas inlet to control ambient gas composition and/or humidity in the neighbourhood of the sensor plate.

20. A holder according to claim 1, the holder furthermore comprising a guiding system formed in the bottom part to position the sensor plate in the holder.

* * * * *